United States Patent
Sasaki

(10) Patent No.: US 8,266,573 B2
(45) Date of Patent: Sep. 11, 2012

(54) METHOD AND SYSTEM FOR TEST POINT INSERTION

(75) Inventor: Tsuyoshi Sasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 93 days.

(21) Appl. No.: 12/825,848

(22) Filed: Jun. 29, 2010

(65) Prior Publication Data

US 2011/0022906 A1    Jan. 27, 2011

(30) Foreign Application Priority Data

Jul. 24, 2009   (JP) ................................. 2009-172676

(51) Int. Cl.
*G06F 11/22* (2006.01)
*G06F 17/50* (2006.01)

(52) U.S. Cl. ........................................ 716/136; 716/111

(58) Field of Classification Search .................... 716/13, 716/17, 22, 23
See application file for complete search history.

(56) References Cited

U.S. PATENT DOCUMENTS

| | | | | |
|---|---|---|---|---|
| 3,777,129 A * | 12/1973 | Mehta | ............................ | 716/136 |
| 5,451,489 A * | 9/1995 | Leedy | ............................ | 430/313 |
| 7,207,019 B2 * | 4/2007 | Shiota | ............................ | 716/112 |
| 2007/0136700 A1 * | 6/2007 | Wang et al. | ........................ | 716/4 |
| 2008/0189584 A1 * | 8/2008 | Hilgendorf et al. | ............ | 714/729 |

FOREIGN PATENT DOCUMENTS

JP     2000-250946 A     9/2000

* cited by examiner

*Primary Examiner* — Thuan Do
*Assistant Examiner* — Mohammed Alam
(74) *Attorney, Agent, or Firm* — Foley & Lardner LLP

(57) ABSTRACT

It is desired to suppress an increase of the TAT or a repetition of processing in inserting a test circuit on designing. A test point insertion method includes: extracting a plurality of logic cones from a net list; generating an order for the plurality of logic cones based on a connection relation of logic cells in each of the plurality of logic cones; and setting a test point in each of the plurality of logic cones in turn in accordance with the order.

2 Claims, 8 Drawing Sheets

6-3: CONTROLLABILITY AND
      OBSERVABILITY TEST CIRCUIT

METHOD AND SYSTEM FOR TEST POINT INSERTION

INCORPORATION BY REFERENCE

This Patent Application is based on Japanese Patent Application No. 2009-172676. The disclosure of the Japanese Patent Application is incorporated herein by reference.

BACKGROUND OF THE INVENTION

1. Field of the Invention

The present invention relates to a method and a system for test facilitation designing used to detect failures in an LSI (large-scale integrated circuit) or the like.

2. Description of Related Art

In association with the increase of the complexity and the size of integrated circuits such as the LSI, the DFT (Design For Test) design has become required for generating a test pattern for realizing a high failure detection rate. As one means for the DFT, scan designing is made and ATPG (Automatic Test Pattern Generation) is carried out, thereby making it possible to generate a pattern having a high detection rate. To generate a pattern having higher detection rate, it is required to adopt a DFT method (which is referred to as "test point insertion method" herein) so as to be able to improve circuit controllability and observability.

As the test point insertion method, there are known several methods. As an ordinary method, a pattern is generated by the ATPG and a portion having poor controllability and poor observability (a part a failure of which cannot be detected or of which it is difficult to detect a failure) is identified by a failure simulation. A test circuit is inserted into the identified portion for improving the controllability and observability.

However, with this ordinary method, the part into which a test circuit is inserted is identified after the DFT and ATPG. It is, therefore, required to return to a step before the DFT to insert the test circuit into that part. Such a method requires large-scale iteration, so that the method is not appropriate for a product whose design TAT is short.

One example of background arts is Japanese Patent Application Publication JP-P2000-250946A (referred to as Patent Document 1 in this specification). In the processing flow shown in FIG. 1 in the Patent Document 1, a random pattern is generated to perform a failure simulation. If the failure detection rate of the circuit obtained by the simulation is not sufficiently high, a test point identification processing is performed. The test point is identified as follows. Test point insertion candidates are selected and a test circuit is "hypothetically" inserted into each of the test point candidates. A failure simulation is carried out to see if the detection rate of the circuit improves. If the detection rate improves, the test point insertion candidate is identified as a test point.

SUMMARY

According to the above-mentioned technique, a part the failure of which cannot be detected or of which it is difficult to detect a failure is identified using a pattern generation and a failure simulation. If the controllability and observability improve by inserting the test circuit into such a part, the part is identified as a test point. Although such processing can produce a high improvement effect by inserting the test point, it disadvantageously takes time to identify the test point insertion part.

Furthermore, in case of a circuit that has been subjected to the DFT (particularly scan designing), it is required to return to a step before the DFT so as to insert a test circuit after the test point is identified for the following reason. If FFs are employed in the test circuit for improving the controllability and the observability, it is required to return to a stage before scan insertion so as to automatically incorporate the FFs of the test circuit into a scan chain using an ordinary scan designing tool.

According to an aspect of the present invention, a test point insertion method includes: extracting a plurality of logic cones from a net list; generating an order for the plurality of logic cones based on a connection relation of logic cells in each of the plurality of logic cones; and setting a test point in each of the plurality of logic cones in turn in accordance with the order.

According to another aspect of the present invention, a test point insertion system include: an extraction part for extracting a plurality of logic cones from a net list; a generation part for generating an order for the plurality of logic cones based on a connection relation of logic cells in each of the plurality of logic cones; and a set part for setting a test point in each of the plurality of logic cones in turn in accordance with the order.

According to an aspect of the present invention, a structure and a configuration of each logic cone are analyzed using the net list available in an initial design phase, and the test point on each logic cone is identified and a test circuit is inserted based on the analysis result. It is, therefore, possible to suppress an increase in TAT for identifying the test point and iterative processing accompanied by large return in processing stage for inserting a test circuit.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

A method and a system for test point insertion according to some exemplary embodiments of the present invention will be described below referring to accompanying drawings.

Figure 1:
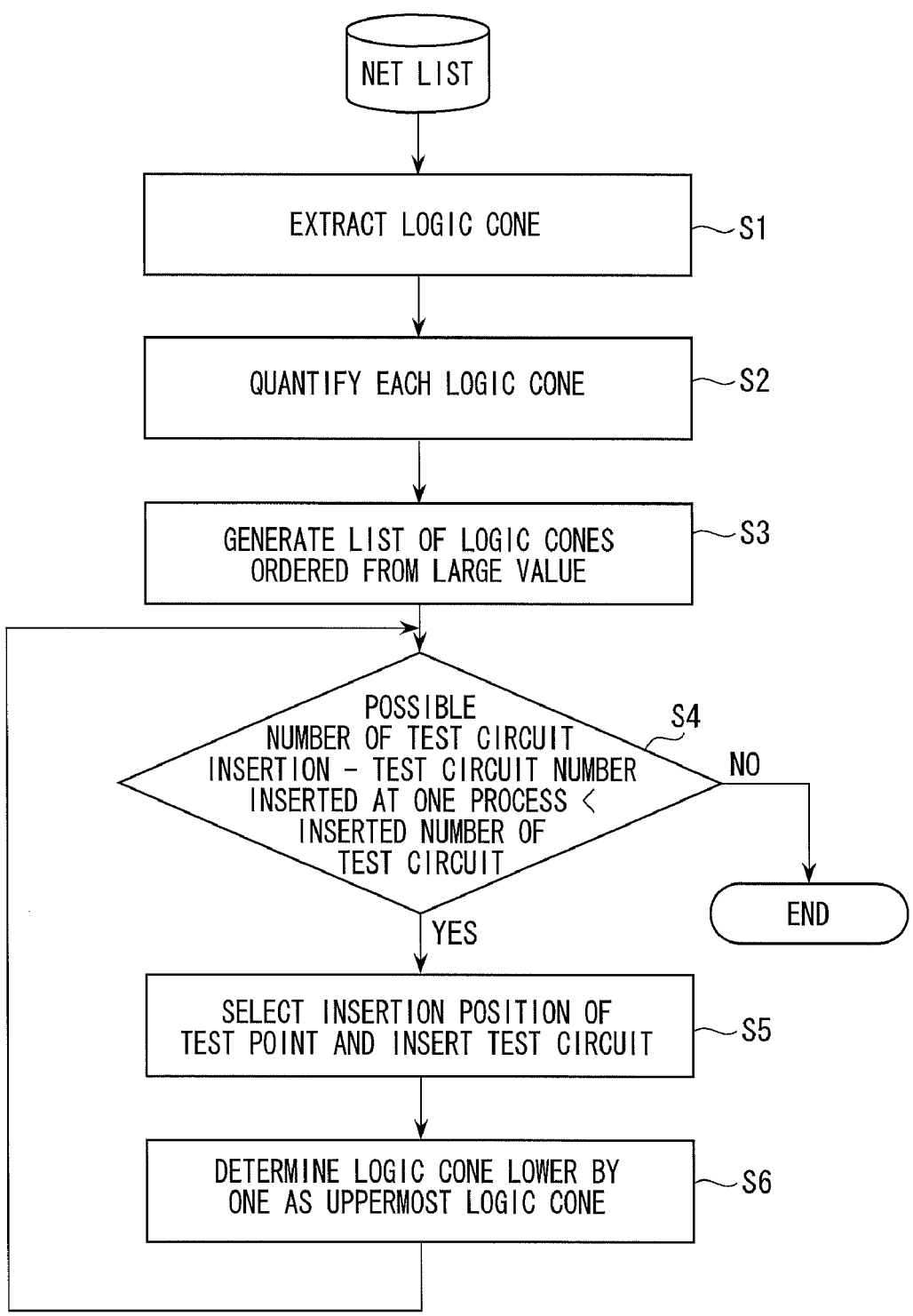
FIG. 1 is a flowchart showing a test point insertion method according to an embodiment of the present invention.

FIG. 1 is a flowchart of a test point insertion method according to an embodiment of the present invention. This method will be described using an example of logic cones shown in FIG. 5.

Figure 5:
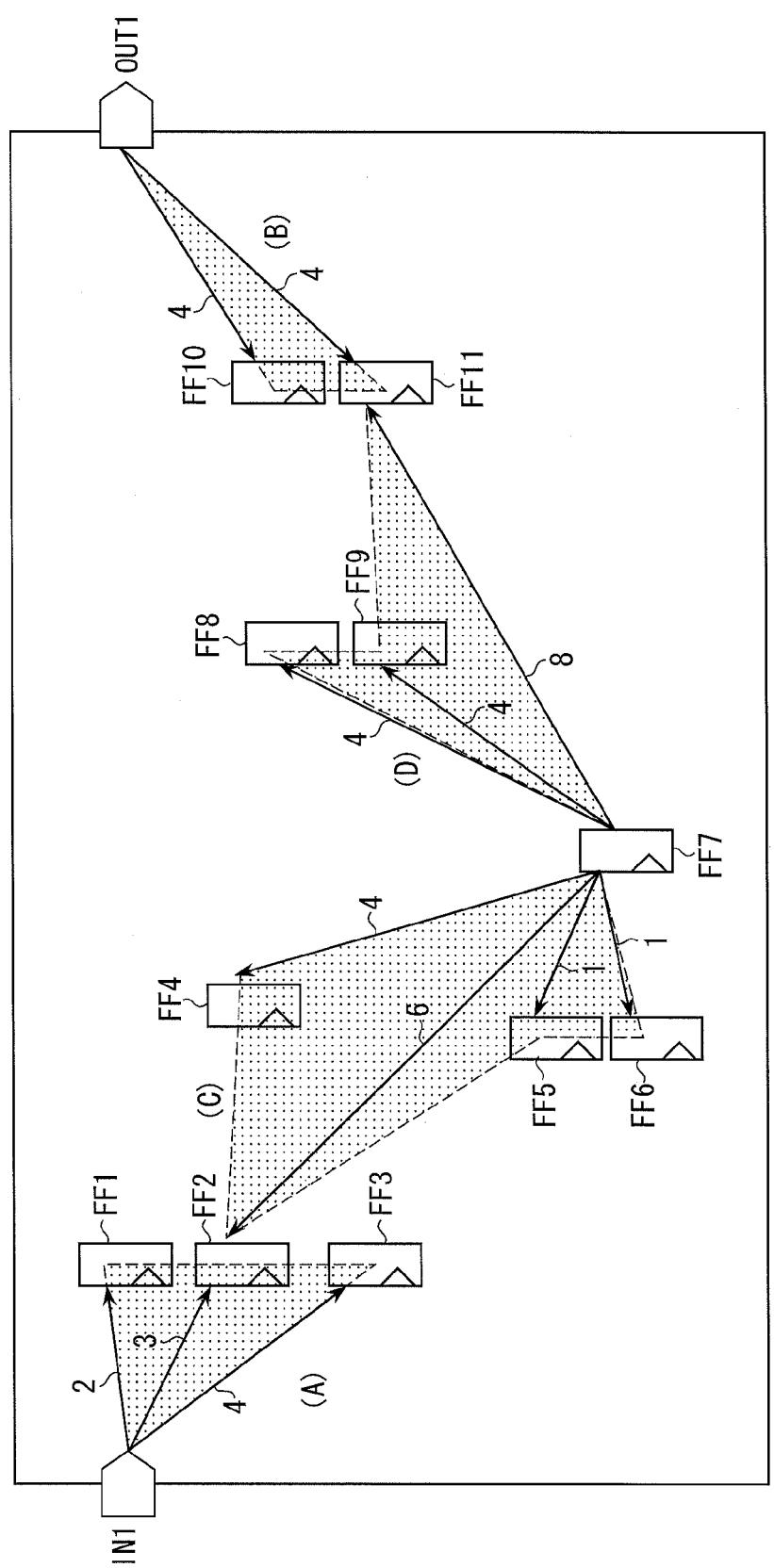
FIG. 5 shows an exemplary circuit showing logic cones and the number of logic stages.

FIG. 5 shows an example of a circuit including four logic cones (A), (B), (C), and (D). The logic cone (A) is configured to include three Paths, that is, Path "IN1→FF1" having two logic stages, Path "IN1→FF2" having three logic stages, and Path "IN1→FF3" having four logic stages. The logic cone (B) is configured to include two Paths, that is, Path "OUT1 →FF10" having four logic stages and Path "OUT1→FF11" having four logic stages. The logic cone (C) is configured to include four Paths, that is, Path "FF7→FF6" having one logic stage, Path "FF7→FF5" having one logic stage, Path "FF7→FF2" having six logic stages, and Path "FF7→FF4" having four logic stages. The logic cone (D) is configured to include three Paths, that is, Path "FF7→FF8" having four logic stages, Path "FF7→FF9" having four logic stages, and Path "FF7→FF11" having eight logic stages.

As shown in the flowchart of FIG. 1, the test point insertion method according to the present embodiment includes the following steps.

Figure 7:
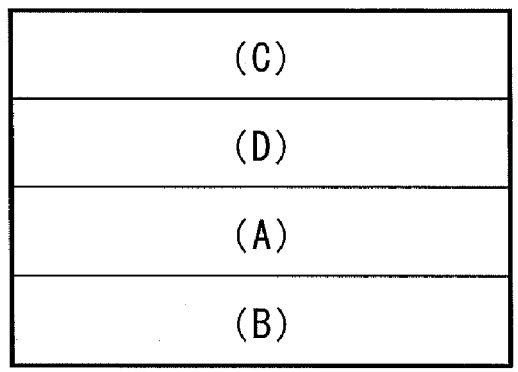
FIG. 7 is a logic cone list in which (A), (B), (C), and (D) show logic cone names.

Step S1: Extract logic cones from an inputted net list.
Step S2: Quantify each of the logic cones.
Step S3: Make list of logic cones. FIG. 7 shows an example of the logic cone list.
Step S4: Determine an end condition.
Step S5: Insert a test circuit.
Step S6: Repeat operation for correcting the logic cone list.

Figure 2:
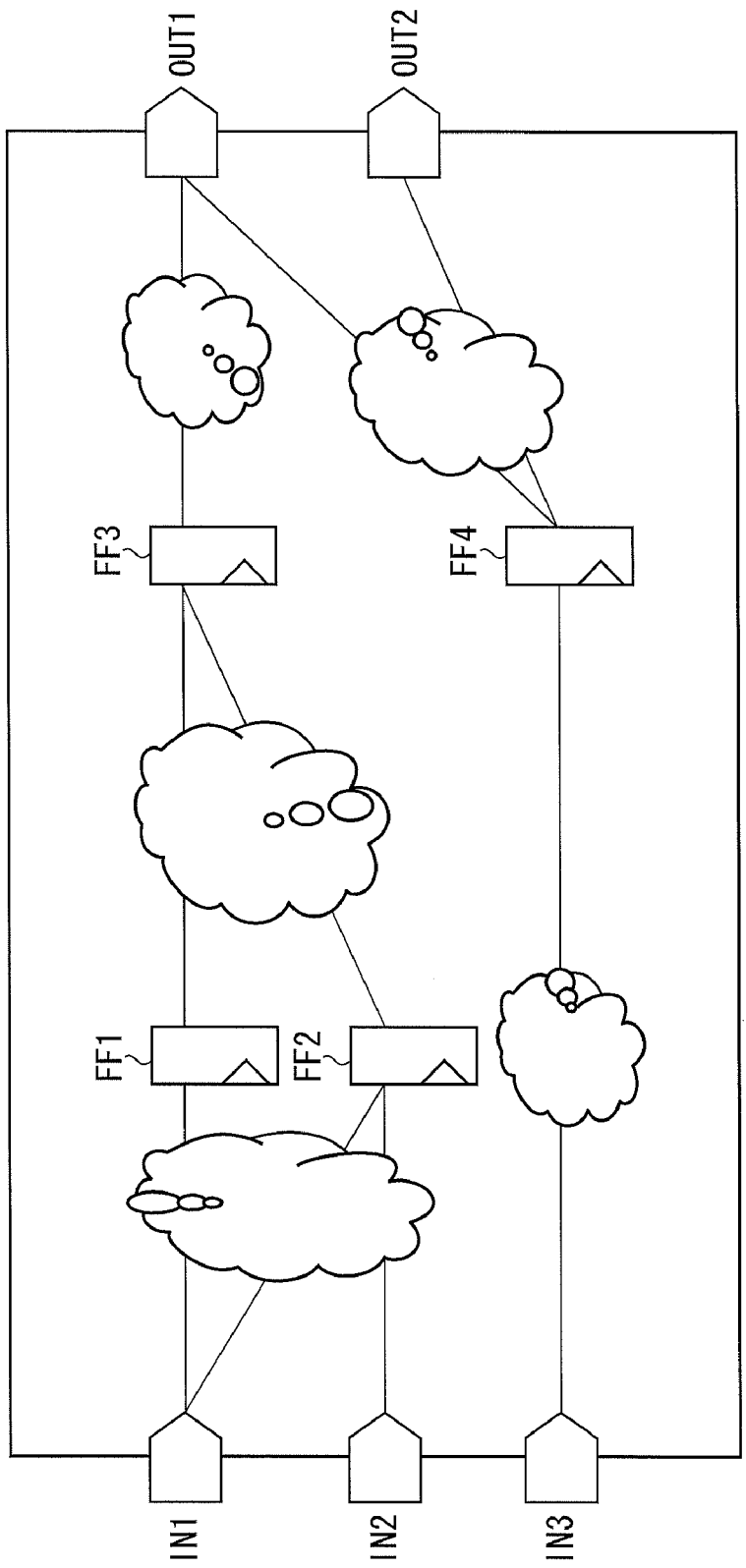
FIG. 2 shows an exemplary circuit having a logic cone configuration shown in FIGS. 3 and 4.

FIG. 2 shows an exemplary circuit prepared for describing the logic cones mentioned herein. The exemplary circuit of FIG. 2 is used as an original circuit of the circuit diagrams shown in FIGS. 3 and 4. This circuit includes external input terminals IN1, IN2, and IN3, external output terminals OUT1 and OUT2, and flip-flops (hereinafter, "FFs") FF1, FF2, FF3, and FF4. Cloud-shaped symbols drawn among the external input terminals, the external output terminals, and the FFs express unspecified combinational circuits, respectively.

Figure 3:
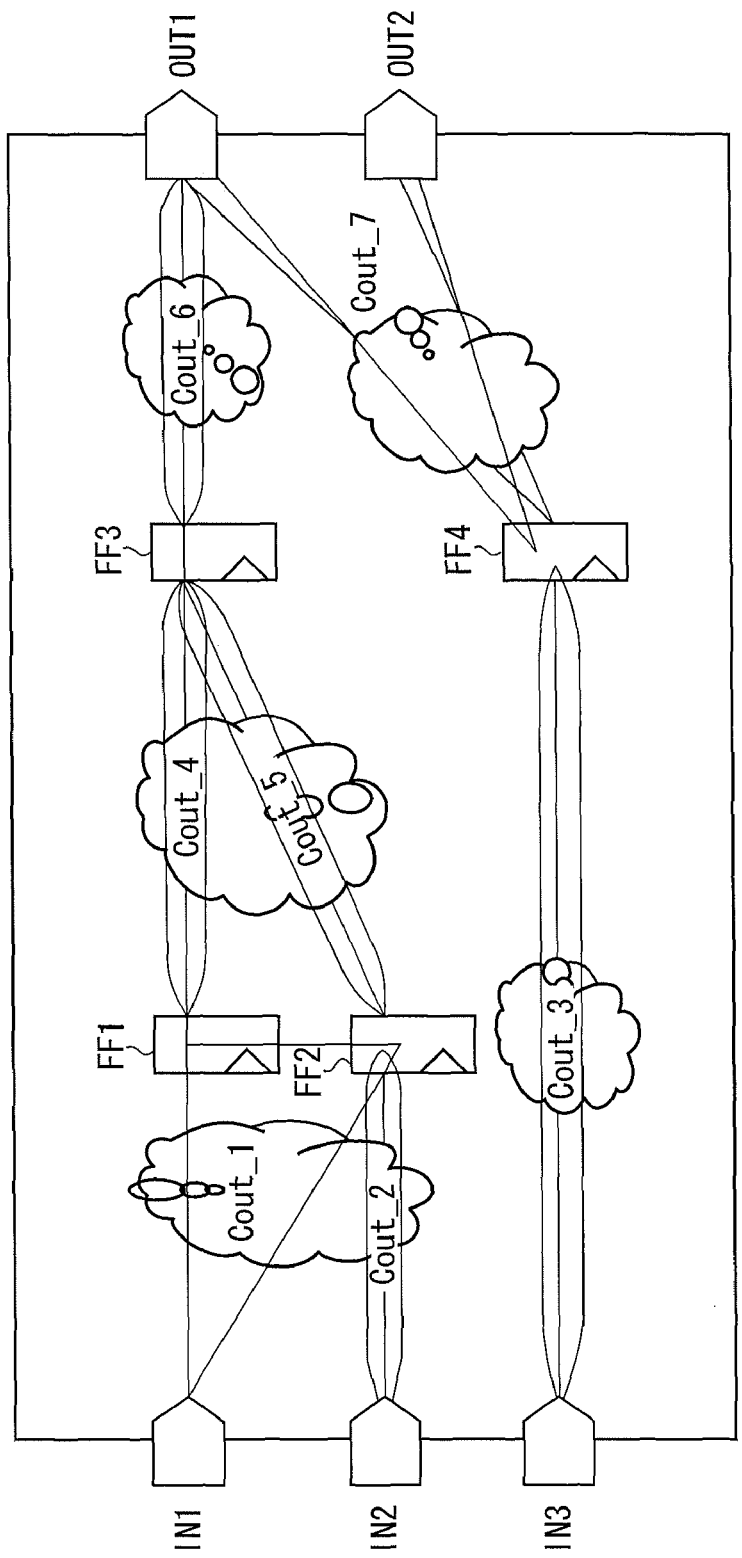
FIG. 3 is a circuit diagram showing logic cones in a case where external input terminals and data output terminals of FFs are set as starting points using the exemplary circuit shown in FIG. 2.

FIG. 3 shows logic cones each generated by a collection of Paths from respective signal output-side terminals of a circuit toward an output side thereof. Starting points of the respective Paths are external input terminals IN1, IN2, and IN3 and data output terminals of FF1, FF2, FF3, and FF4. End points of the respective Paths are terminus of Paths that are traced from the starting points in 0020 the direction of external output terminals OUT1 and OUT2 and that reach the external output terminals OUT1 and OUT2 or data input terminals of the FF1, FF2, FF3, and FF4. For example, a logic cone Cout_1 shown in FIG. 3 is a collection of Paths the starting point of which is the external input terminal IN1 and the end points of which are the data input terminals of the FF1 and FF2, respectively.

Figure 4:
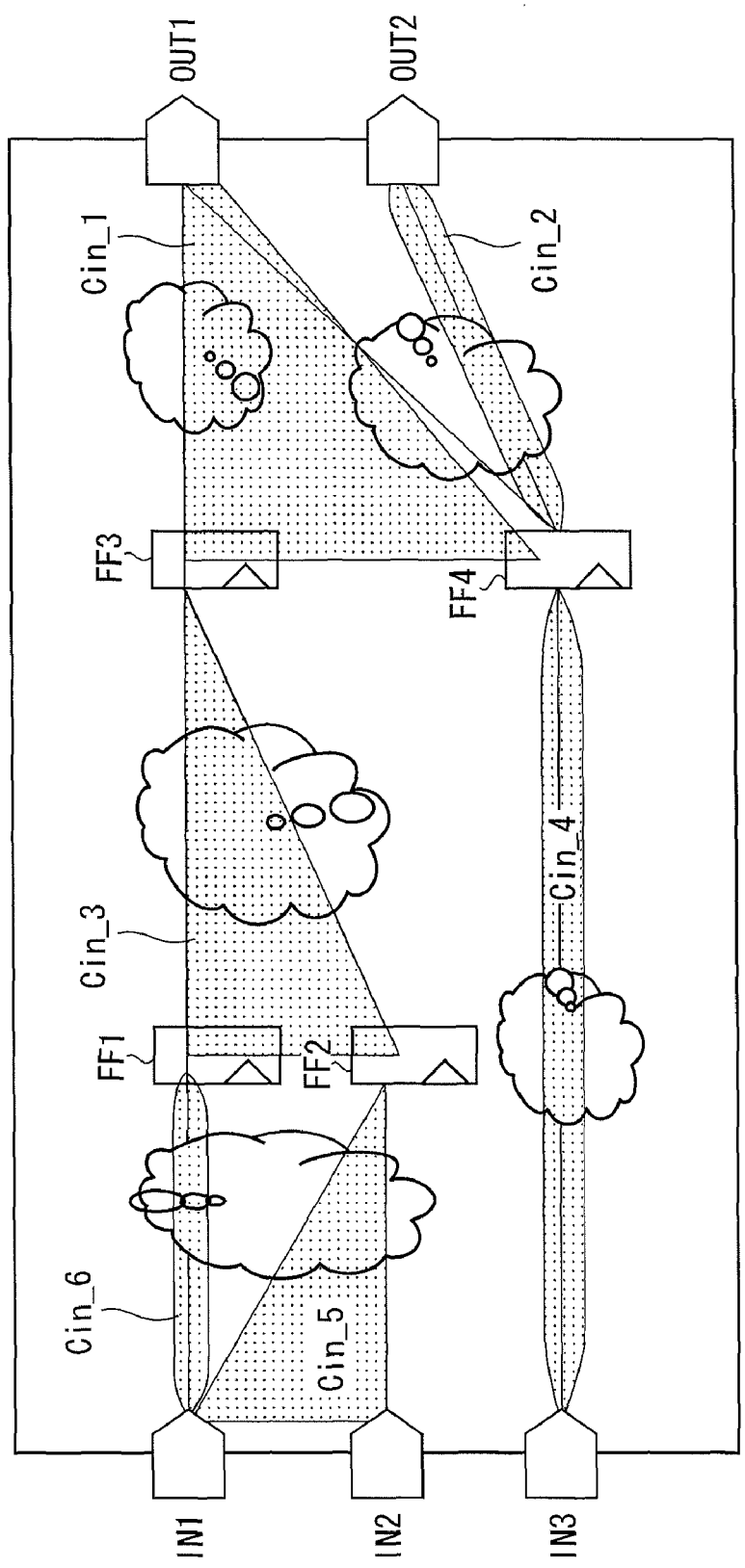
FIG. 4 is a circuit diagram showing logic cones in a case where external output terminals and data input terminals of FFs are set as starting points using the exemplary circuit shown in FIG. 2.

FIG. 4 shows logic cones each generated by a collection of Paths from respective signal input-side terminals of a circuit toward an input side thereof. Starting points of the respective Paths are external output terminals OUT1 and OUT2 and data input terminals of FF1, FF2, FF3, and FF4. End points of the respective Paths are terminus of paths that are traced from the starting points in a direction of external input terminals IN1, IN2, and IN3 and that reach data output terminals of the FF1, FF2, FF3, and FF4. For example, a logic cone Cin_3 shown in FIG. 4 is a collection of Paths the starting point of which is the data input terminal of the FF3 and the end points of which are the data output terminals of the FF1 and FF2, respectively.

Figure 6A:
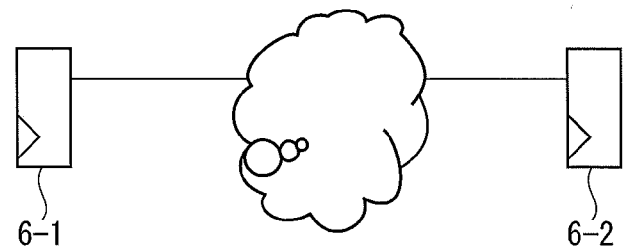
FIG. 6A shows an exemplary circuit into which a test point is inserted.
Figure 6B:
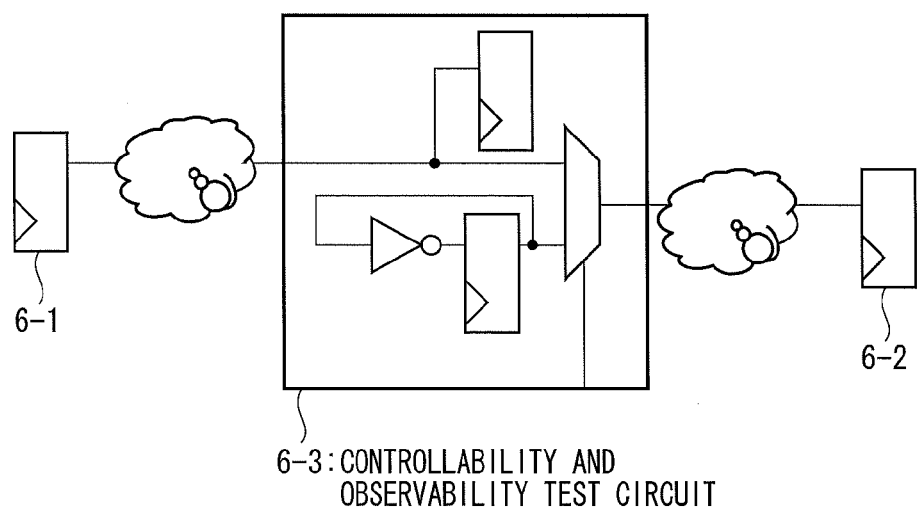
FIG. 6B shows an exemplary test circuit inserted into a test point so as to improve both controllability and observability.

FIG. 6A shows an example of a circuit to which the test point insertion method according to the present embodiment is applied. By inserting a controllability and observability test circuit 6-3 between flip-flop elements 6-1 and 6-2 of FIG. 6A as shown in FIG. 6B, controllability and observability can improve.

Figure 8:
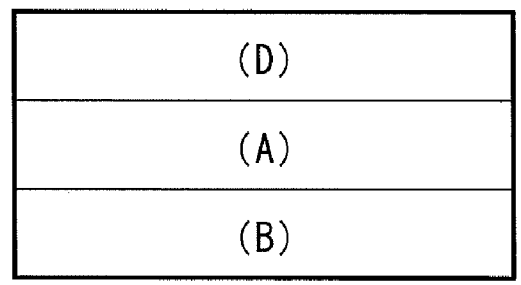
FIG. 8 is a logic cone list from which the logic cone (C) is excluded.

FIG. 7 shows a logic cone list of the example of FIG. 5. Test point settings are made to the logic cones in an order starting from a higher cone in such a logic cone list. In the example of FIG. 5, the test point settings are made in order from (C), (D), (A), to (B). FIG. 8 shows a logic cone list after test circuits are inserted into the logic cone (C). By excluding the logic cone (C) from the list, the test point setting is made for the next logic cone (D).

Figure 9:
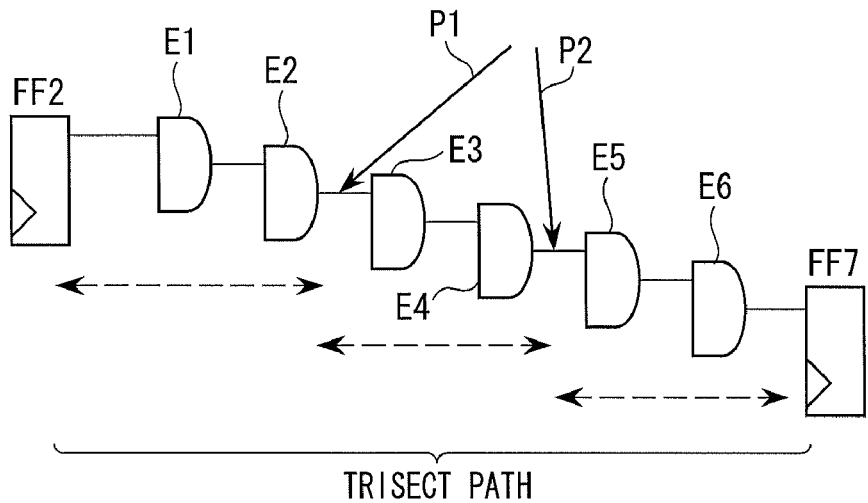
FIG. 9 shows an example of identifying test points.

FIG. 9 shows an example of identifying test points. FIG. 9 shows the example of setting test points to positions P1 and P2, respectively obtained by trisecting Path FF7→FF2 where elements E1 to E6 are present.

The steps of the test point insertion method shown in FIG. 1 will be described in detail.

Step S1: Extract Logic Cones

A plurality of logic cones setting all external input and output terminals and data input and output terminals of all FFs as starting points and end points is extracted from a net list stored in a storage device in advance. It is assumed that only the four logic cones (A), (B), (C), and (D) shown in FIG. 5 can be extracted.

Step S2: Quantify Logic Cones

Logic cone values ConeV are given to a plurality of logic cones, respectively based on connection relationships of logic cells shown in a plurality of extracted logic cones (A), (B), (C), and (D), respectively (note that information on the connection relationships is available from the net list). Each of the logic cones are quantified by this processing.

The logic cones are quantified based on the sum of Paths constituting the respective logic cones and the sum of the number of logic stages of the respective Paths. For example, it is possible to decide each of the logic cone values ConeV using the following logic cone value calculation equation.

$$\text{ConeV (Cone Name)} = (P(L) \times \alpha) \times (P(G) \times \beta)$$

In the Equation, P (L) denotes the sum of logic stages of all the Paths constituting each logic cone and P (G) denotes the sum of the Paths constituting the logic cone. The product between the sum of the logic stages of all the Paths and that of the Paths is an appropriate index for expressing a necessity of a test for each logic cone.

The symbol $\alpha$ denotes a degree of influence of the sum of the logic stages of all the Paths on the controllability and the observability. The symbol $\beta$ denotes a degree of influence of the number of Paths on the controllability and the observability. $\alpha$ and $\beta$ are coefficients that satisfy the relation "$0<\alpha, \beta<=1$" and are set, for example, by an input operation performed by a designer on an input device. In this example, ConeV (A) to ConeV (D) are calculated while assuming that $\alpha=\beta=1$.

First, the ConeV (A) that is the logic cone value of the logic cone (A) is calculated as follows.

The logic cone (A) is configured to include the three Paths, that is, Path "IN1→FF1" having two logic stages, Path "IN1→FF2" having three logic stages, and Path "IN1→FF3" having four logic stages. That is, P (L)=2+3+4=9 and P (G)=3. Therefore, the logic cone value is expressed as follows.

$$\text{ConeV }(A) = 9\alpha \times 3\beta = 27$$

Likewise, the respective cone logic values ConeV (B), ConeV (C), and ConeV (D) are calculated as follows.

ConeV $(B)=(4+4)\alpha \times 2\beta = 8\alpha \times 2\beta = 16$

ConeV $(C)=(1+1+4+6)\alpha \times 4\beta = 12\alpha \times 4\beta = 48$

ConeV $(D)=(4+4+8)\alpha \times 3\beta = 12\alpha \times 3\beta = 48$

Step S3: Make Logic Cone List

Based on the calculation result in the step S2, the quantified logic cone values are arranged in a list in descending order, namely from larger one to smaller one, thereby generating one sequence for a plurality of logic cones (a ranking of logic cones). For the logic cones equal in the value, the logic cones are sequenced automatically based on an any preset algorithm. In this example, the logic cones (C) and (D) are equal in value, that is, the values thereof are 48. Then it is required to sequence the two logic cones. In the following description, it is assumed that the logic cone list is generated so that the logic cone (C) is higher in order than the logic cone (D).

Step S4: Determine End Condition

It is assumed that the preset insertable number of test circuits is N1, the number of test points (test circuits) inserted per processing is N2, and that the number of test points already set and inserted is N3. If the relation "N1−N2<3" is satisfied, the test point insertion processing goes to the step S5. If N1−N2≧N3, the test point insertion processing ends.

The insertable number N1 of test circuits is calculated from an upper limit value of an overhead area by preset test circuits and an area of one test circuit. If it is assumed, for example, that "the upper limit value of the overhead area by the test circuits" is 1000 Grids and that "the area of one test circuit" is 100 Grids, 1000/100=10. Accordingly, the insertable number of test circuits is 10. The number N2 of test circuits inserted per processing is the number of test circuits inserted in the processing of one step S5. The number N3 of inserted test circuits is the sum of the test circuits actually inserted in this processing.

Step S5: Insert Test Circuits

Test points are set to each of a plurality of logic cones according to the sequence of the list generated in the step S3. Specifically, the highest logic cone (logic cone arranged in the highest order) in the logic cone list is selected and set as the target logic cone into which test circuits are inserted. In this example, the logic cone (C) is set as the test circuit insertion target.

The Path having the most logic stages is selected from among those of the logic cone (C). In this case, the Path "FF7→FF2" having six logic stages is selected as a target Path. The target Path is divided equally by "(the number of test circuits inserted per processing)+1", and test circuits are inserted into divided Paths (in this example, "the number of test circuits inserted per processing" is assumed as "2"). Namely, as shown in FIG. 9, the Path "FF7→FF2" having the six logic stages is trisected and two test circuits shown in FIG. 6 are inserted into the divided Paths. If the target Path cannot be divided equally, the target Path is divided as closely to equal division as possible and the test circuits are inserted into the respective division points.

Step S6: Correct Logic Cone List

The logic cone into which the test circuits are inserted in the step S5 is excluded from the logic cone list. That is, as shown in FIG. 8, the highest-order logic cone is excluded and the orders of the second highest logic cone and the following are carried up.

The processing from the steps S4 to S6 are repeatedly carried out until the number exceeds "the insertable number of test circuits". If the logic cone list is "null" as a result of the step S6 but the number does not exceed "the insertable number of test circuits", then the net list completed with the test circuit insertion is set as an input net list, and the processing from the steps S1 to S6 are repeated.

As described above, by using the net list available in an initial design phase, it is possible to decide priorities of the logic cones into each of which test points are inserted and to decide into which parts inside each logic cone the test circuits are inserted based on results of analyzing structures and configurations of the logic cones.

By carrying out test point insertion in an initial design phase based on information available in the initial design phase, it is possible to avoid iterative processing accompanying the test point insertion processing. Further, it is possible to insert the test circuits in short time since it is possible to identify the test points and to insert the test circuits based on analyses performed on the logic cones. From these two features, it is possible to insert test points even into an LSI product having short design TAT.

Figure 10:
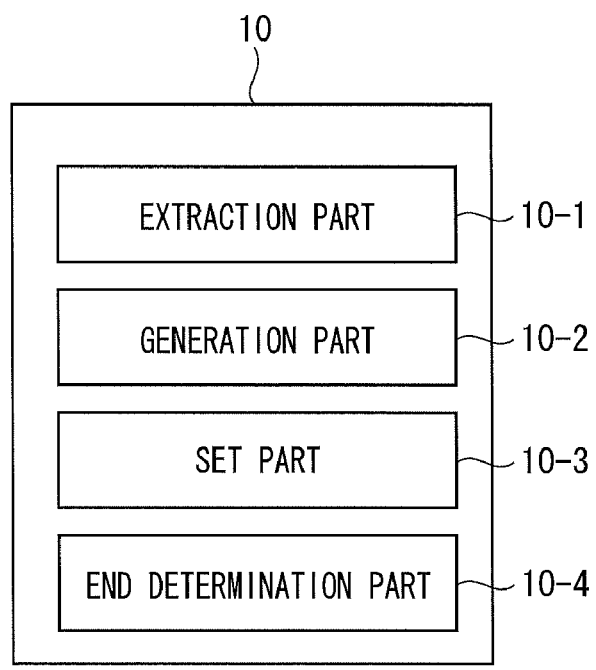
FIG. 10 shows a configuration of a test point insertion system.

FIG. 10 shows a test point insertion system 10 for performing the processing described so far. The test point insertion system 10 includes an extraction part 10-1, a generation part 10-2, a set part 10-3, and an end determination part 10-4. The test point insertion system 10 can be realized by a computer. These respective parts can be realized by causing a CPU to read and execute a computer readable program stored in a storage medium.

In such a test point insertion system 10, the net list is stored in the storage medium in advance. The extraction part 10 performs the processing of the step S1, thereby automatically extracting the logic cones from the net list. The generation part 10-2 quantifies the respective extracted logic cones based on the logic cone value calculation equation stored in the storage medium in advance and generates the logic cone list (steps S2 and S3). The end determination part 10-4 performs the determination processing of the step S4. The set part 10-3 automatically inserts a test circuit by the processing of the step S5. Further, the set part 10-3 performs a list update processing for excluding the logic cone into which the test circuits are inserted from the highest order in the logic cone list and for carrying up the second and following orders of the logic cones, and returns the processing to the processing of the step S4. The test point insertion system 10 performing such operation can realize insertion of test points.

Although the present invention has been described above in connection with several embodiments thereof, it would be apparent to those skilled in the art that those exemplary embodiments are provided solely for illustrating the present invention, and should not be relied upon to construe the appended claims in a limiting sense.

What is claimed is:

1. A computer executable test point insertion method comprising:
    extracting, with at least one computer, a plurality of logic cones from a net list;
    generating an order for the plurality of logic cones based on a connection relation of logic cells in each of the plurality of logic cones; and
    setting a test point in each of the plurality of logic cones in turn in accordance with the order;
    wherein the order is generated based on a sum of the number of at least one path forming each of the plurality of logic cones and a sum of the number of logic stages of each of the at least one path;

wherein the order is determined by a value generated by a following expression:

$$(P(L) \times \alpha) \times (P(G) \times \beta)$$

wherein P (G) is a sum of the number of at least one path forming each of the plurality of logic cones, and P (L) is a sum of the number of logic stages of the at least one path, and $\alpha$ and $\beta$ are preset coefficients.

2. A computer executable test point insertion method comprising:
- extracting, with at least one computer, a plurality of logic cones from a net list;
- generating an order for the plurality of logic cones based on a connection relation of logic cells in each of the plurality of logic cones;
- setting a test point in each of the plurality of logic cones in turn in accordance with the order; and:
- ending the setting when a following inequality is satisfied:

$$N1 - N2 \geq N3$$

wherein N1 is a preset insertable number of test circuits, N2 is the number of test points inserted by processing the setting at one time, and N3 is the number of test points already set by the setting, and in the setting, a setting of the test point is repeated in accordance with the order when a following inequality is satisfied:

$$N1 - N2 < 3.$$

* * * * *